United States Patent
Motoda et al.

[11] Patent Number: 5,906,860
[45] Date of Patent: May 25, 1999

[54] APPARATUS FOR TREATING A SUBSTRATE WITH RESIST AND RESIST-TREATING METHOD

[75] Inventors: Kimio Motoda; Kiyomitsu Yamaguchi; Yoshitaka Matsuda, all of Kumamoto; Tetsu Kawasaki, Yamanashi-ken, all of Japan

[73] Assignee: Tokyo Electron Limited, Tokyo, Japan

[21] Appl. No.: 08/832,816

[22] Filed: Apr. 4, 1997

[30] Foreign Application Priority Data

Apr. 9, 1996 [JP] Japan .................................... 8-111139
Apr. 15, 1996 [JP] Japan .................................... 8-115248

[51] Int. Cl.$^6$ ............................. B05D 3/12; B05C 11/02
[52] U.S. Cl. ...................... 427/240; 427/385.5; 427/425; 118/52; 118/663
[58] Field of Search ................ 427/240, 385.5, 427/425; 118/8, 52, 663

[56] References Cited

U.S. PATENT DOCUMENTS

| | | | |
|---|---|---|---|
| 4,748,053 | 5/1988 | Okada | 427/240 |
| 4,941,426 | 7/1990 | Sago et al. | 118/52 |
| 5,234,499 | 8/1993 | Sasaki et al. | 118/52 |
| 5,439,519 | 8/1995 | Sago et al. | 118/52 |

FOREIGN PATENT DOCUMENTS 2513992  4/1996  Japan .

*Primary Examiner*—Janyce Bell
*Attorney, Agent, or Firm*—Oblon, Spivak, McClelland, Maier & Neustadt, P.C.

[57] ABSTRACT

The invention provides an apparatus for treating a substrate with resist, comprising a spin chuck for horizontally holding a substrate, a first motor for variably rotating the spin chuck, a nozzle for applying resist solution onto the upper surface of the substrate held on the spin chuck, a cup having an upper opening through which the substrate is put in or taken out of the cup and a lower opening through which extends the driving shaft of the spin chuck, the cup positioned to surround the substrate held on the spin chuck to receive liquid centrifugally separated from the substrate which is rotated about its axis, a lid to close the upper opening of the cup to define a space around the substrate, a second motor for variably rotating the cup independently of the spin chuck rotation, a liftable cylinder for relatively moving at least one of the spin chuck and cup, which are positioned apart from each other, toward each other to achieve mutual contact, and an O-ring for hermetically sealing the mutual contact portion between the cup and spin chuck when these cup and spin chuck are brought into mutual contact by the liftable cylinder. When the cup and spin chuck are brought into mutual contact by the liftable cylinder, the lower opening of the cup is closed by the spin chuck to form a hermetic space. The spin chuck and cup are rotated in synchronism by first and second motors while the chamber is kept hermetically closed.

27 Claims, 12 Drawing Sheets

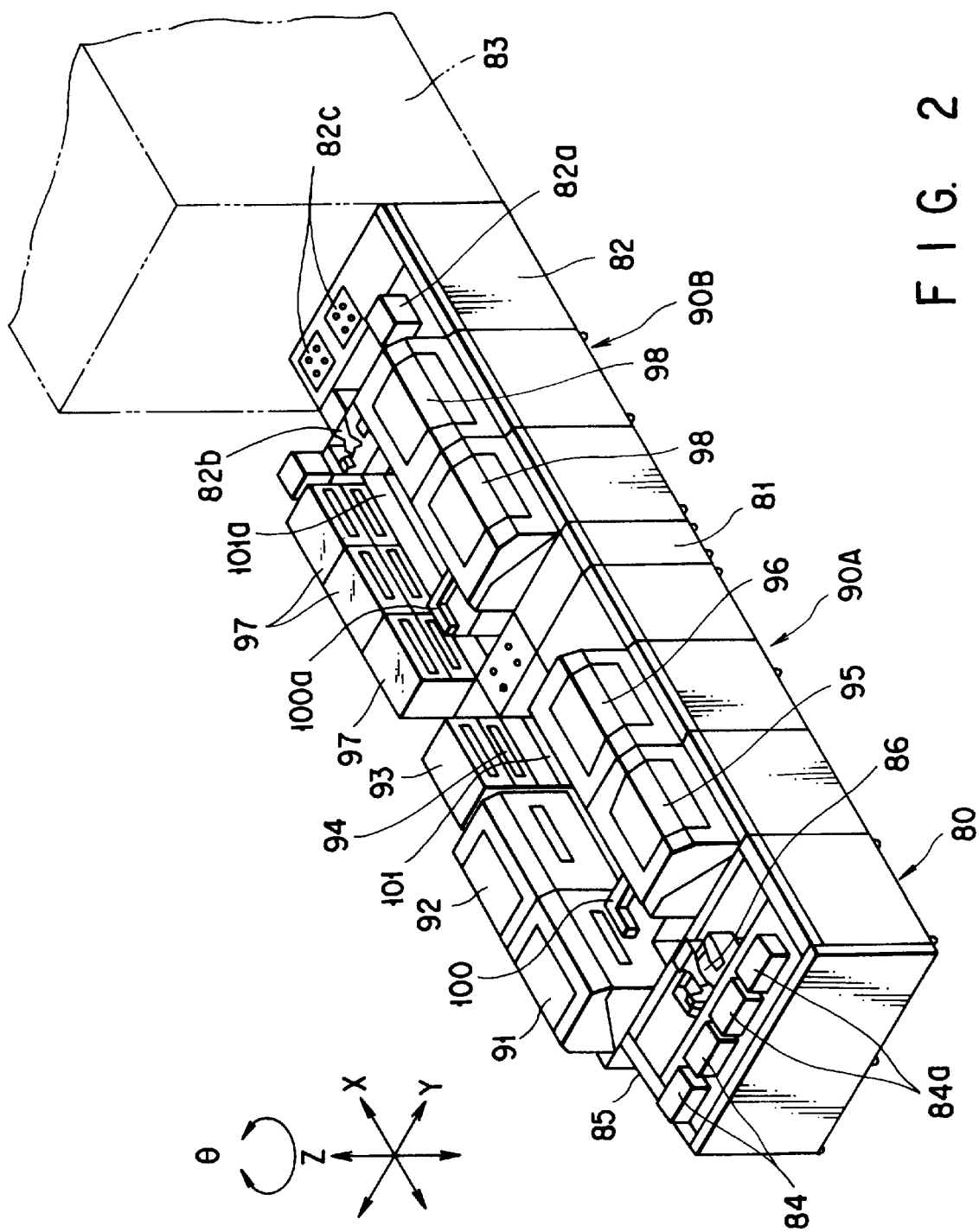
F I G. 2

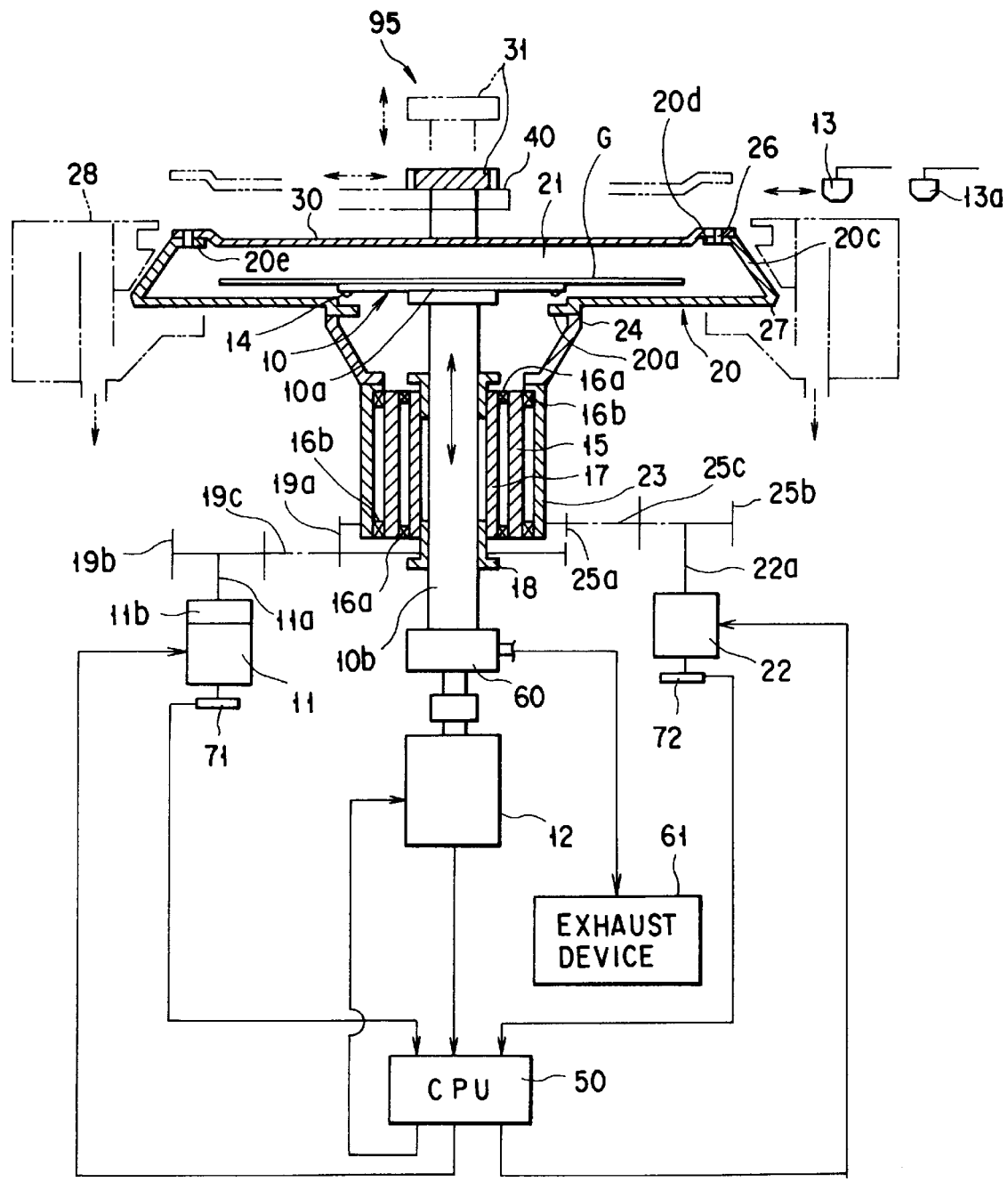
F I G. 3

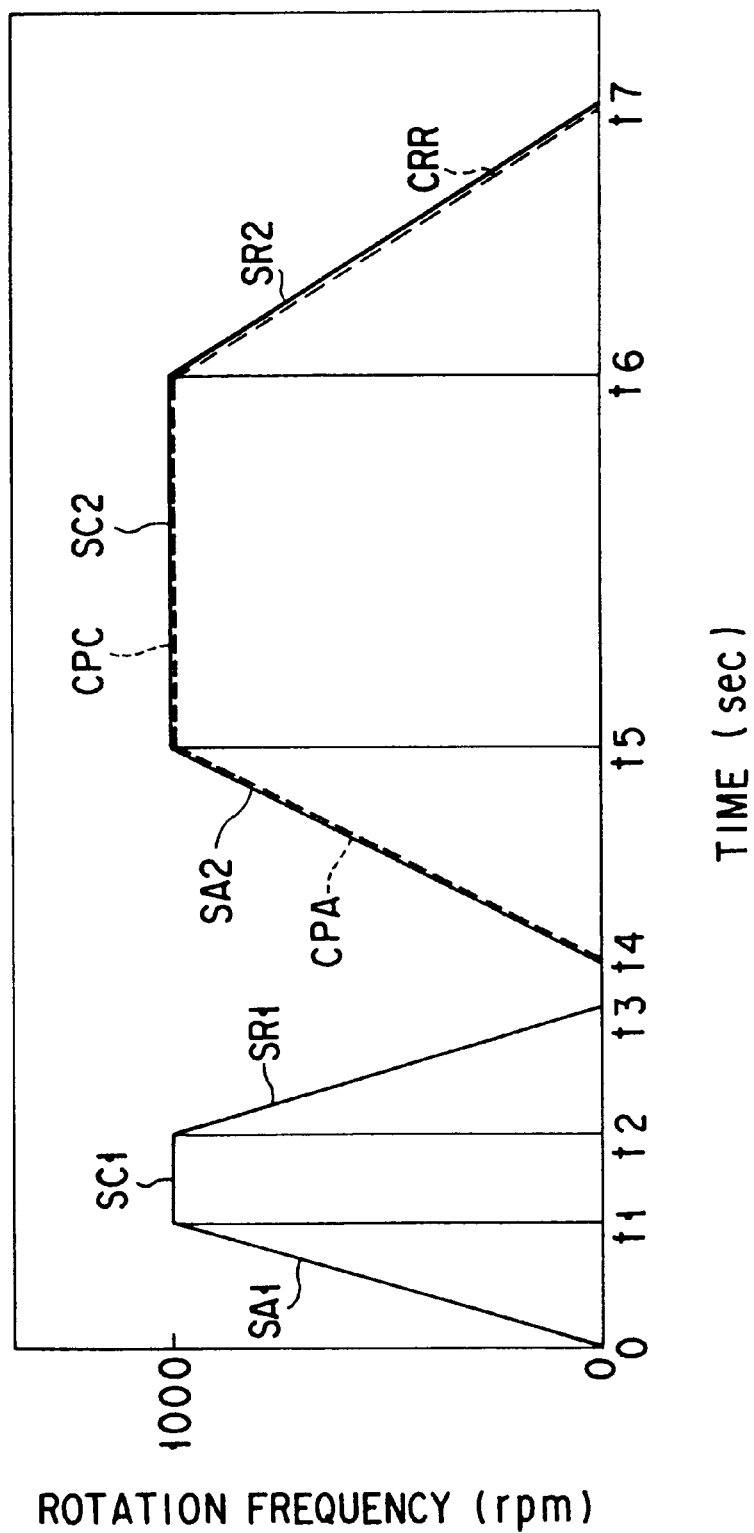
F I G. 7

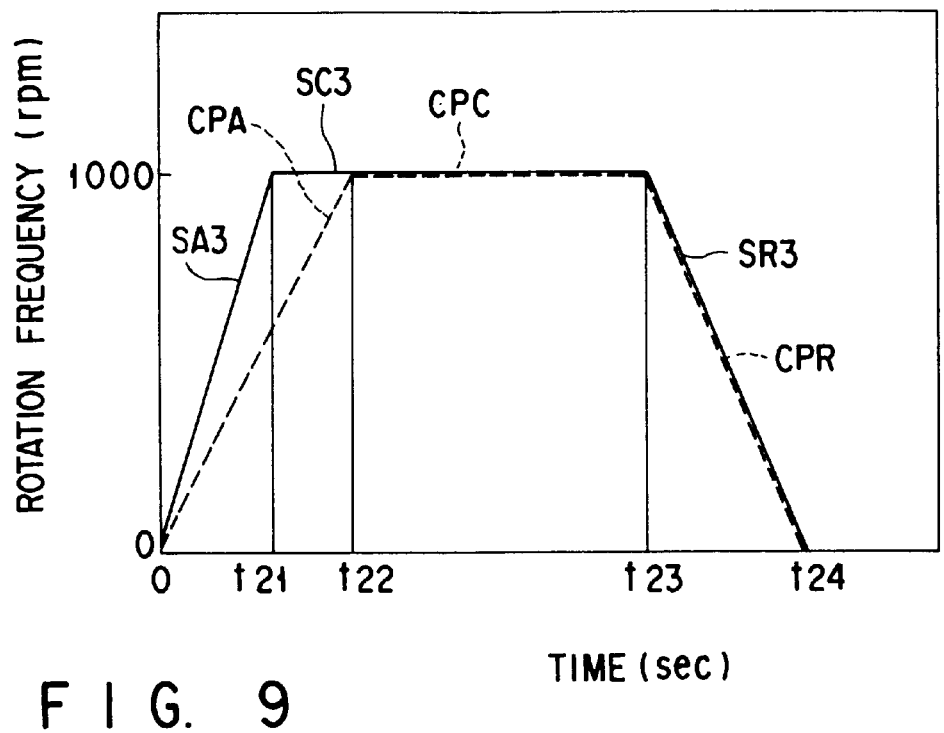
F I G. 9
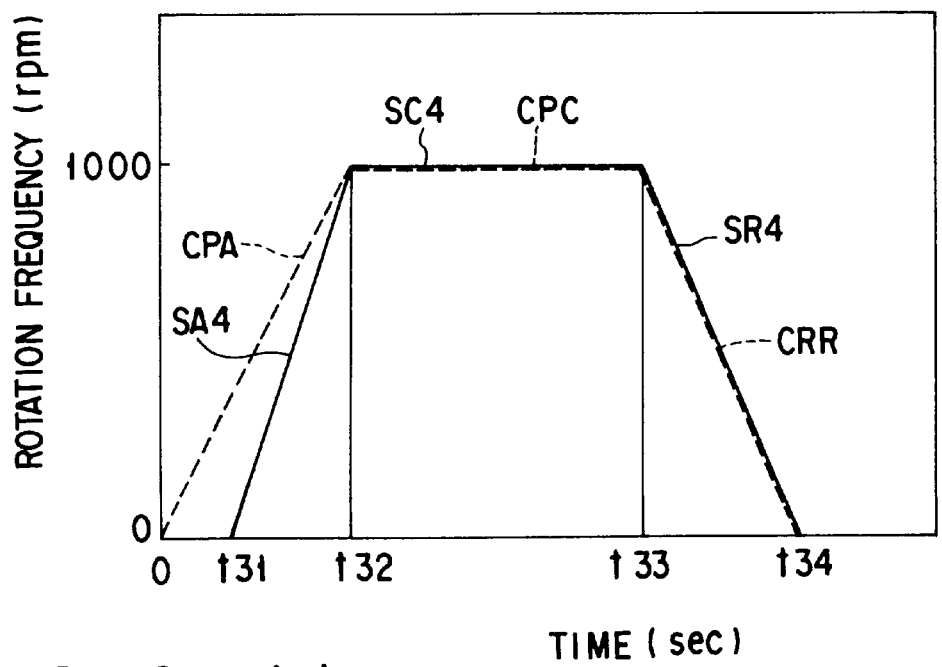
F I G. 11

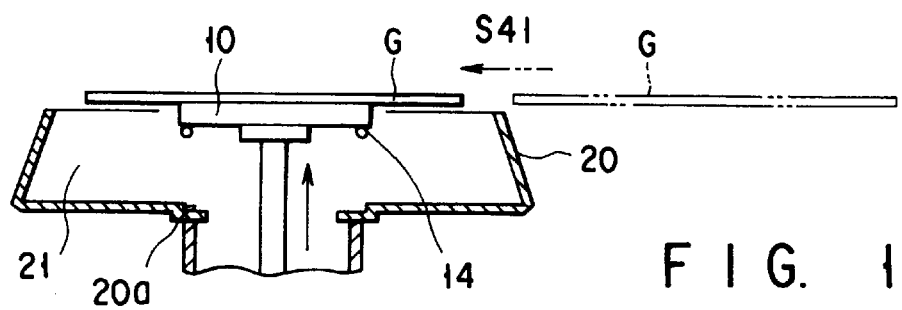
F I G. 13A
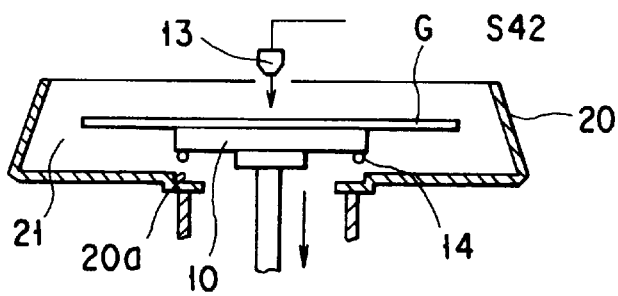
F I G. 13B
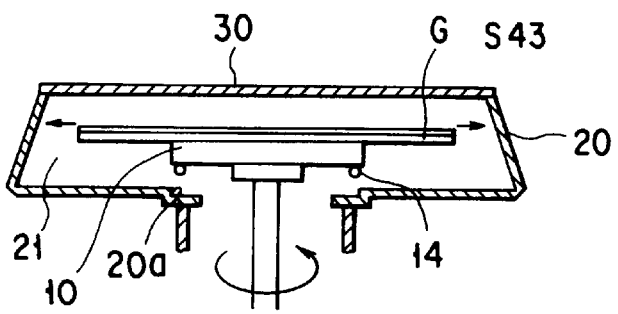
F I G. 13C
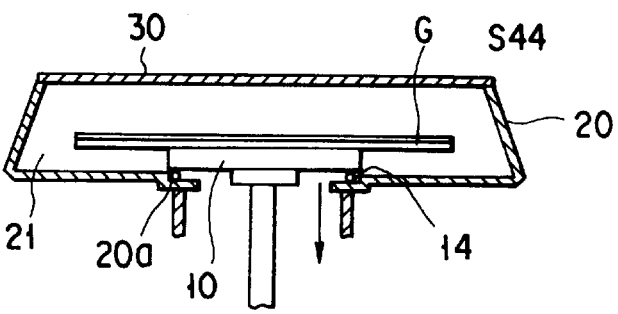
F I G. 13D
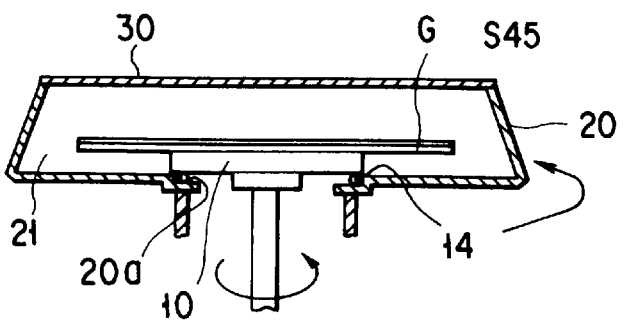
F I G. 13E

APPARATUS FOR TREATING A SUBSTRATE WITH RESIST AND RESIST-TREATING METHOD

BACKGROUND OF THE INVENTION

The present invention relates to a resist-treating apparatus, i.e., apparatus for coating a substrate such as an LCD substrate or a semiconductor wafer, with resist, followed by developing the resist coating, and to a resist-treating method.

In the manufacture of a liquid crystal display (LCD) device, a photolithography technology similar to that employed in the manufacture of a semiconductor device is utilized in general for forming an ITO (indium tin oxide) thin film or an electrode pattern on a glass substrate of the LCD device. In the photolithography technology, a substrate is coated with a photoresist, followed by selectively exposing the coating to light and subsequently developing the exposed pattern.

In the resist coating step, a rotary cup type resist coating apparatus, in which a cup is rotated together with a substrate, is used in order to coat the substrate surface with a resist uniformly. FIG. 1 shows the rotary cup type coating apparatus disclosed in U.S. patent application Ser. No. 08/416,368 filed by the present applicants on Apr. 4, 1995. As shown in the drawing, a spin chuck 10 and a cup 20 are commonly connected to the driving shaft of a motor 1 via timing belts 2, with the result that these spin chuck 10 and cup 20 are rotated in synchronism.

In the conventional apparatus shown in FIG. 1, an upper lid 30 is lifted upward by a robot arm 40, followed by transferring a substrate G onto the spin chuck 10 by operating a main arm (not shown) of a substrate transfer mechanism. The substrate G is held on the spin chuck 10 by vacuum suction. Under this condition, a nozzle (not shown) is positioned upward of the substrate G so as to allow a resist solution to be dripped from the nozzle onto the upper surface of the substrate G. When the nozzle is retreated, the robot arm 40 is operated again to put the upper lid 30 to close the upper opening of the cup 20 so as to form a hermetic treating space 21. Under this condition, the spin chuck 10, cup 20, lid 30 and substrate G are rotated in synchronism, with the result that a resist coating film is centrifugally formed in a uniform thickness on the upper surface of the substrate G.

With increases in the degree of integration and fineness of the semiconductor devices and with enlargement of the semiconductor wafers, the cup 20 tends to be enlarged in recent years. What should be noted is that the cup 20, which is enlarged, and the spin chuck 10 have a large inertia moment, making it difficult to accelerate or decelerate these cup 20 and spin chuck 10 promptly. In other words, it takes an unduly long time for these cup 20 and spin chuck 10 to reach a predetermined rotation speed (rpm) from the start-up time. Likewise, an unduly long time is required for the cup 20 and spin chuck 10, which are rotated at a predetermined operating speed, to be stopped completely. It follows that the through-put of the apparatus is lowered.

It may be reasonable to use a large motor for overcoming the above-noted problem. If both the spin chuck 10 and cup 20 are rotated by a large motor, however, a power consumption is increased. Further, in the case of using a large motor, the coating apparatus is rendered bulky. Naturally, the treating system and the auxiliary facilities thereof are rendered bulky as a whole.

BRIEF SUMMARY OF THE INVENTION

An object of the present invention is to provide an apparatus for treating a substrate with resist, the apparatus permitting efficiently rotating a spin chuck, which holds a wafer, and a cup so as to improve the through-put and product yield, and to provide a resist treating method.

Another object is to provide an apparatus for treating a substrate with resist, the apparatus permitting miniaturizing the apparatus, and to provide a resist treating method utilizing the particular apparatus.

According to a first embodiment of the present invention, there is provided an apparatus for treating a substrate with resist, comprising:

a spin chuck for horizontally holding a substrate;

first rotating means for variably rotating the spin chuck;

nozzle means for applying a resist solution to an upper surface of the substrate held by the spin chuck;

a cup having an upper opening through which the substrate is put in or taken out of the cup and a lower opening through which extends the driving shaft of the spin chuck, and surrounding the substrate held by the spin chuck for receiving and discharging the liquid centrifugally separated from the substrate which is rotated about its own axis;

a lid member, which can be opened, closing the upper opening of the cup for defining a treating space around the substrate together with the cup;

second rotating means for variably rotating the cup independently of the spin chuck rotation;

moving means for relatively moving at least one of the spin chuck and the cup, which are positioned away from each other, toward each other to achieve mutual contact; and sealing means for hermetically sealing the contact region between the spin chuck and the cup when these spin chuck and cup are brought into mutual contact by the moving means, wherein, when the cup and the spin chuck are brought into mutual contact by the moving means, the lower opening of the cup is closed by the spin chuck so as to form a hermetic treating space, and both the spin chuck and the cup are rotated in synchronism by the first and second rotating means while the treating space is held hermetically closed.

According to a second embodiment of the present invention, there is provided an apparatus for treating a substrate with resist, comprising:

a spin chuck for horizontally holding a substrate;

nozzle means for applying a resist solution to an upper surface of the substrate held by the spin chuck;

rotating means for variably rotating the spin chuck;

a cup having an upper opening through which the substrate is put in or taken out of the cup and a lower opening through which extends the driving shaft of the spin chuck and surrounding the substrate held by the spin chuck for receiving the liquid centrifugally separated from the substrate which is rotated about its own axis;

a lid member, which can be opened, closing the upper opening of the cup for defining a treating space around the substrate together with the cup;

moving means for relatively moving at least one of the spin chuck and the cup, which are positioned away from each other, toward each other to achieve mutual contact;

sealing means for hermetically sealing the contact region between the spin chuck and the cup when these spin chuck and cup are brought into mutual contact by the moving means;

a first engaging member mounted to the spin chuck; and a second engaging member mounted to the cup so as to achieve engagement with the first engaging member, wherein, when the cup and the spin chuck are brought into mutual contact by the moving means, the first engaging member is engaged with the second engaging member, and the lower opening of the cup is closed by the spin chuck so as to form a hermetic treating space, the spin chuck and the cup being rotated in synchronism by the rotating means while the treating space is kept hermetically closed.

According to a first aspect of the present invention, there is provided a method of treating a substrate with resist, in which a resist solution is supplied to a substrate rotated by a spin chuck, and the liquid centrifugally separated from the substrate is received by a cup, comprising the steps of:

(a) allowing the substrate to be held substantially horizontal by a spin chuck;

(b) supplying a resist solution to an upper surface of the substrate;

(c) starting up rotation of the substrate about its own axis together with the spin chuck, and starting up rotation of a cup;

(d) detecting the angular rotation speed of the spin chuck;

(e) detecting the angular rotation speed of the cup;

(f) controlling the rotation of at least one of the cup and the spin chuck so as to permit the detected rotation speed of the cup to be equal to the detected rotation speed of the spin chuck;

(g) relatively moving at least one of the spin chuck and the cup to bring these spin chuck and cup into a hermetic mutual contact to form an integral structure when the detected rotation speed of the cup has been found to be equal to that of the spin chuck; and (h) allowing the cup and the spin chuck to be rotated in synchronism so as to spread the resist solution or liquid for resist-treatment supplied to the substrate along the entire region of the upper surface of the substrate under a hermetic atmosphere.

In step (c) of the method defined above, rotation of the spin chuck and the cup may be started up simultaneously. Alternatively, it is possible for the spin chuck to be started up after start up of the cup. It is also possible to control the acceleration of each of the spin chuck and the cup in step (c) before the angular rotation speed of each of these spin chuck and cup reaches a predetermined operating speed after the start up.

Further, both the cup and the spin chuck, which are under mutual contact, may be decelerated after step (h) such that the rotation of these cup and spin chuck is stopped simultaneously.

Further, according to a second aspect of the present invention, there is provided a method of treating a substrate with resist, in which a resist solution is supplied to a substrate rotated by a spin chuck, and the liquid centrifugally separated from the substrate is received by a cup, comprising:

(A) the step of allowing the substrate to be held substantially horizontal by a spin chuck;

(B) the step of supplying a resist solution to the upper surface of the substrate held on the spin chuck;

(C) the first spreading step, in which the rotation of the spin chuck is started up at a first acceleration to a first desired angular rotation speed so as to spread the resist solution or the liquid for resist-treatment supplied to the substrate along the upper surface of the substrate;

(D) the step of stopping the rotation of the spin chuck;

(E) the step of relatively moving at least one of the spin chuck and the cup toward each other so as to bring these spin chuck and cup into a hermetic mutual contact so as to form an integral structure and to provide a hermetic environment around the substrate held on the spin chuck; and (F) the second spreading step, in which the rotation of each of the cup and the spin chuck is accelerated to reach a second desired angular rotation speed at a second acceleration lower than the first acceleration so as to permit the cup and the spin chuck to be rotated in synchronism, thereby to spread further the resist solution or liquid for resist-treatment along the entire region of the upper surface of the substrate under a hermetic atmosphere.

In the method of the second aspect defined above, it is possible for the first desired angular rotation speed in the first spreading step (C) to be equal to the second desired angular rotation speed in the second spreading step (F). Alternatively, the first desired angular rotation speed in the first spreading step (C) may be lower than the second desired angular rotation speed in the second spreading step (F). Further, both the cup and the spin chuck, which are under mutual contact, may be decelerated after step (F) such that the rotation of these cup and spin chuck is stopped simultaneously.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is an oblique view schematically showing the outer appearance of a resist coating-developing system for LCD (liquid crystal display) substrates;

FIG. 3 is cross sectional view schematically showing an apparatus for treating a substrate with resist according to one aspect of the present invention;

FIG. 7 is a timing chart showing the rotation speed of each of the spin chuck and the cup relative to time in respect of the first embodiment of the present invention;

FIG. 9 is a timing chart showing the rotation speed (rpm) of each of the spin chuck and the cup relative to time in respect of the second embodiment of the present invention;

FIG. 11 is a timing chart showing the rotation speed (rpm) of each of the spin chuck and the cup relative to time in respect of the third embodiment of the present invention;

FIGS. 13A, 13B, 13C, 13D and 13E collectively form a flow chart showing steps S41 to S45 included in the method of treating a substrate with resist according to a fourth embodiment of the present invention.

DETAILED DESCRIPTION OF THE INVENTION

Figure 1:
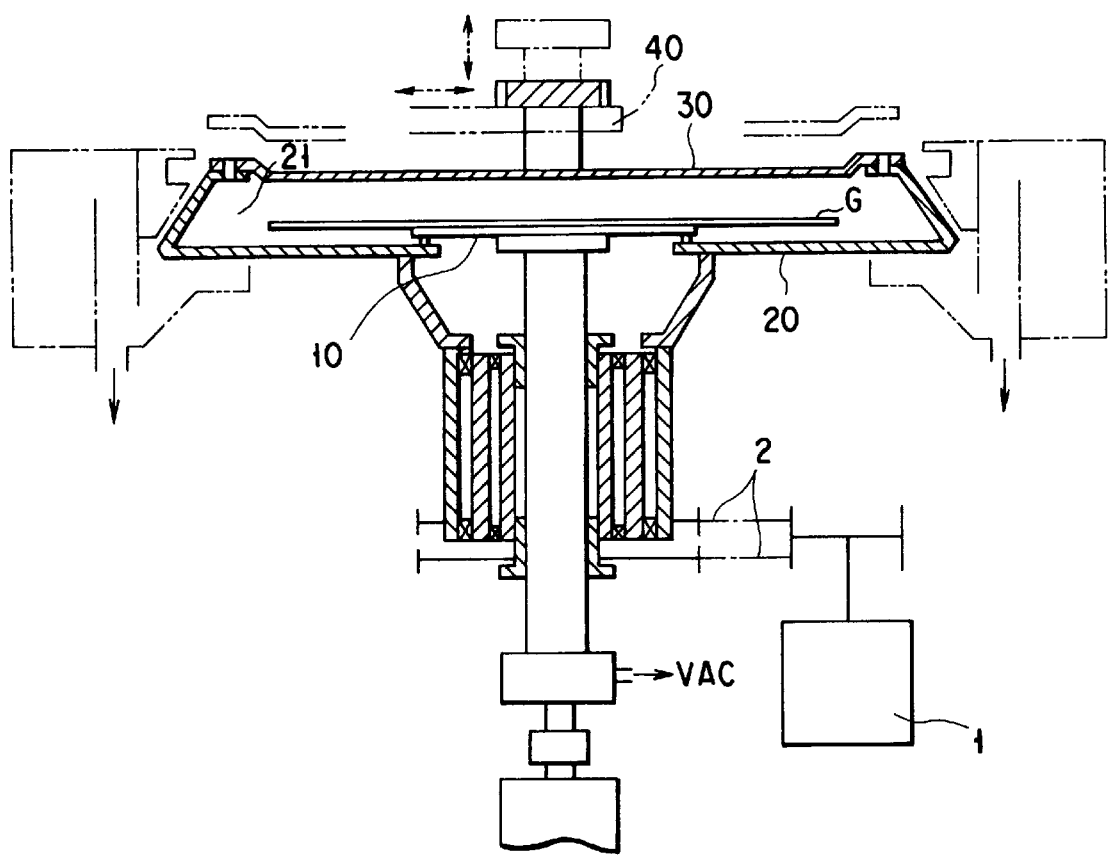
FIG. 1 is cross sectional view schematically showing a conventional apparatus for treating a substrate with resist.

Let us describe an apparatus of the present invention for treating a substrate with resist with reference to the accompanying drawings, which cover various preferred embodiments for the cases of incorporating the resist-treating apparatus of the present invention in a resist coating/developing system.

Specifically, the resist coating/developing system comprises a loader section 80 for transferring substrates into and out of the system, a first treating section 90A of a substrate G, and a second treating section 90B communicating with the first treating section 90A with an interface section 81 interposed therebetween. A light exposure device 83 for selectively exposing a resist film to light to form a predetermined fine light-exposed pattern can be disposed adjacent to the second treating section 90B with a transfer section 82 interposed therebetween.

The loader section 80 includes a cassette 84 for housing untreated wafers G, a cassette table 85 on which is disposed a cassette 84a for housing treated substrates G, and a transfer system 86 movable in x-axis, y-axis and z-axis directions and rotatable about any of these x-, y- and z-axes for transfer of untreated and treated substrates G between the cassettes 84 and 84a on the cassette table 85.

A main arm 100 movable in x-axis, y-axis and z-axis directions and rotatable about any of these x-, y- and z-axes is arranged to be movable along a transfer path 101 extending in the x-axis direction in the central region of the first treating section 90. Arranged on one side of the transfer path 101 of the main arm 100 within the first treating section 90A are a brush-washing device 91 for brush-washing the substrate G, a jet water washing device 92 for washing the substrate G with a high pressure jet water, an adhesion treating device 93 for making the surface of the substrate G hydrophobic, and a cooling device 94 for cooling the substrate G to a predetermined temperature. On the other hand, a resist coating device 95 of the present invention and a coated film-removing device 96 are arranged on the other side of the transfer path 101.

Another main arm 100a movable in x-axis, y-axis and z-axis directions and rotatable about any of these x-, y- and z-axes is arranged to be movable along a transfer path 101a extending in the x-axis direction in the central region of the second treating section 90. A heating section 97 for heating the substrate G both before and after the coating with a resist solution for the pre-baking and post-baking purposes is arranged on one side of the transfer path 101a of the main arm 100a, with a developing device 98 arranged on the other side of the transfer path 101a.

It should be noted that the interface section 81 can be withdrawn from the first treating section 90A or the second treating section 90B, as required, for allowing an operator to enter the treating section 90A or 90B for the maintenance or inspection of the treating section.

The transfer section 82 includes a cassette 82a for temporarily storing the substrates G, a pair of pincers 82b for taking or putting the substrates G out of or in the cassette 82a, and support tables 82c of the substrates G.

In the resist coating/developing system described above, the untreated substrates G housed in the cassette 84 are taken out by the transfer system 86 included in the loader section 80 and, then, delivered to the main arm 100 included in the first treating section 90A. Further, the untreated substrates G are transferred along the transfer path 101 into the brush-washing device 91 or the jet water-washing device 92 for receiving a washing treatment. After the washing treatment, the surfaces of substrates G are made hydrophobic by a treatment applied within the adhesion treating device 93, followed by cooling the substrates G in the cooling device 94. Then, the substrates G are coated with a treating solution, e.g., a resist solution, within the resist coating device 95 so as to form a resist film, i.e., a photosensitive film, on the substrate surface. After the coating step, an undesired resist film in the peripheral portion of the substrate G is removed by the coated film-removing device 96, followed by heating the remaining resist film on the substrate surface in the heating device 97 for the baking purpose and subsequently exposing the baked resist film in a predetermined pattern within the exposure device 83. The substrate G after the light-exposure step is transferred into the developing device 98 for developing the light-exposed pattern with a predetermined developing solution. Further, the developing solution is washed out with a rinsing solution so as to complete the developing treatment. The treated substrates G after the developing treatment are housed in the cassette 84a of the loader section 80 and, then, transferred to a succeeding treating step.

FIG. 3 shows in detail the resist coating device 95. As shown in the drawing, the device 95 includes a spin chuck 10, a cup 20, a lid 30, a first motor 11, a second motor 22, a liftable cylinder 12 (moving means), a first nozzle 13, a second nozzle 13a, and a CPU 50. The spin chuck 10 is provided with a vacuum suction device 61 for holding the substrate G by means of vacuum suction. The cup 20 has an upper opening through which the substrate G is put in or taken out of the cup 20. The upper opening of the cup 20 is closed by the lid 30, which is movably supported by an opening-closing mechanism (not shown). If the lid 30 is disposed to close the upper opening of the cup 20, a closed space, in which the spin chuck 10 and the substrate G are arranged, is defined. The spin chuck 10 is driven by the first motor 11, with the cup 20 being driven by the second motor 22. The liftable cylinder 12 permits the spin chuck 10 to be moved in a z-axis direction. The first nozzle 13 communicates with a resist solution supply source (not shown) equipped with a mass flow controller (not shown). The second nozzle 13a communicates with a liquid thinner supply source (not shown) equipped with a mass flow controller (not shown). The supply amounts of the resist solution and liquid thinner are controlled on the basis of command signals given from the CPU 50. Further, each of the first nozzle 13 and the second nozzle 13a is movably supported by a moving means (not shown) and is movable based on the command signals given from the CPU 50 from a home position outside the cup 20 to a dripping position right above the cup 20.

A seal member 14 acting as a hermetic means, i.e., a downward annular projection, is formed on the lower surface at the outer circumferential region of the support section 10a of the spin chuck 10 such that the tip of the seal member 14 abuts against the upper surface of the bottom of the cup 20. As a result, a clearance between the spin chuck 10 and the cup 20 is hermetically closed so as to hermetically seal the treating space 21. Needless to say, a seal member consisting of an upward annular projection may be formed on the bottom of the cup 20 in place of the downward annular projection shown in the drawing.

The rotation of the first motor 11 and the second motor 22 is controlled by a control means, e.g., a CPU 50. The CPU 50 also permits the liftable cylinder 12 to be moved in the vertical direction.

The spin chuck 10 is rotatable in a horizontal plane via a rotary shaft 10b, which is rotated by the driving of the first motor 11, and is movable in a vertical direction by the driving of the liftable cylinder 12 joined to the rotary shaft 10b. In the embodiment shown in the drawing, the rotary shaft 10b is slidably joined to a spline bearing 18 engaged with the circumferential surface of a rotatable cylinder 17 which is rotatably mounted via a bearing 16a to the inner circumferential surface of a stationary collar 15. A driven pulley 19a is mounted to the spline bearing 18. Further, a timing belt 19c is stretched between the driven pulley 19a and a driving pulley 19b joined to a driving shaft 11a of the first motor 11. It follows that the rotary shaft 10b is rotated via the timing belt 19c by the driving of the first motor 11 so as to rotate the spin chuck 10. The lower portion of the rotary shaft 10b is joined to the liftable cylinder 12 via a vacuum seal portion 60, with the result that the rotary shaft 10b can be moved in the vertical direction by the driving of the liftable cylinder 12.

A rotatable outer cylinder 23 is mounted via a bearing 16b to the outer circumferential surface of the stationary collar 15. Also, the cup 20 is mounted to a connecting cylinder 24 fixed to the upper end portion of the rotatable outer cylinder 23. It should be noted that a timing belt 25c is stretched between a driven pulley 25a mounted to the rotatable outer cylinder 23 and a driving pulley 25b mounted to a driving shaft 22a of the second motor 22. It follows that the driving force of the second motor 22 is transmitted to the cup 20 so as to rotate the cup 20 within a horizontal plane.

A labyrinth seal (not shown) is formed in each of the sealing portions between the stationary collar 15 and the rotatable inner cylinder 17 and between the stationary collar 15 and the rotatable outer cylinder 23 so as to prevent the particles generated in the driving system positioned in the lower region from entering the cup 20.

The cup 20 has a side wall 20c inclined inward such that the inner diameter of the cup 20 is gradually diminished toward the upper end. Also, the upper end portion of the side wall 20c is bent inward so as to form an inward flange 20e. A plurality of air supply holes 26, which are positioned a predetermined distance apart from each other in the circumferential direction, are formed through the inward flange 20e. On the other hand, a plurality of air discharge holes 27, which are positioned a predetermined distance apart from each other in the circumferential direction, are formed through the lower end portion of the side wall 20c of the cup 20. During rotation of the cup 20, the air flowing into the treating space 21 through the air supply holes 26 is discharged to the outside through the air discharge holes 27. As a result, the inner pressure of the treating space 21 is prevented from becoming negative during rotation of the cup 20. It follows that the lid 30 can be opened easily after the coating treatment performed within the cup 20.

A hollow annular drain cup 28 is mounted along the outer circumferential surface of the cup 20 so as to recover the mist scattered from the cup 20 together with the air discharged through the discharge holes 27 of the cup 20.

The robot arm 40 is moved to a region below a head portion 31 which projects upward from the lid 30. Under this condition, the robot arm 40 is moved in a vertical direction. As a result, the lid 30 is moved up or down so as to open or close the upper opening of the cup 20. During the coating operation, the lid 30 is required to close the upper opening of the cup 20 and to be fixed to the cup 20 so as to be rotated together with the cup 20. For the fixing purpose, it is desirable to mount, for example, fixing pins (not shown), which project upward, to the upper portion of the cup 20, with recesses (not shown) for engagement with the fixing pins formed in the lid 30. In this case, the fixing pins and the recesses can be aligned by controlling the rotating angle of the second motor 22 consisting of, for example, a servo motor.

An encoder 71 is mounted to the first motor 22, with another encoder 72 being mounted to the second motor 22. The signals detected by these encoders 71, 72 are transmitted to the CPU 50 for an arithmetic comparison. Then, the rotation speed (rpm) of each of these first and second motors 11, 22 is controlled on the basis of an output signal of the CPU 50.

For example, the rotation speed can be controlled such that the first motor 11 is started up at an acceleration of 1,000 rpm/sec to reach a normal operating speed of 1,000 to 1,500 rpm, followed by allowing the first motor 11 to be rotated at a speed equal to the rotation speed of the second motor 22. In this case, the CPU 50 permits the liftable cylinder 12 to be moved downward so as to bring the seal member 14 (i.e., annual downward projection) into contact with the bottom of the cup 20 so as to hermetically seal the treating space 21, when the rotation speed (rpm) of the first motor 11, i.e., the rotation speed of the spin chuck 10, has been found equal to that of the second motor 22, i.e., the rotation speed of the cup 20.

Incidentally, another means such as a ball screw mechanism may be employed in place of the liftable cylinder 12 for vertically moving the spin chuck 10. Also, it is possible to move the cup 20 in the vertical direction to bring the bottom of the cup 20 into contact with the spin chuck 10. Further, it is possible to arrange a bearing which is brought into contact with the seal member 14 for hermetically sealing the treating space 21.

In the embodiment described above, the CPU 50 is used as a control means. Alternatively, a speed monitor may be used as the control means in place of the CPU 50 so as to confirm the signals generated from the encoders 71, 72 serving to detect the rotation speed (rpm) of the first and second motors 11, 12. Further, the rotation speed can be can be controlled on the basis of the rotating time measured by using a timer. Where a speed monitor or a timer is used for controlling the rotation speed of the motor, it is necessary to provide a mechanism for mechanically absorbing the abrasion between the cup 20 and the spin chuck 10.

Figure 4:
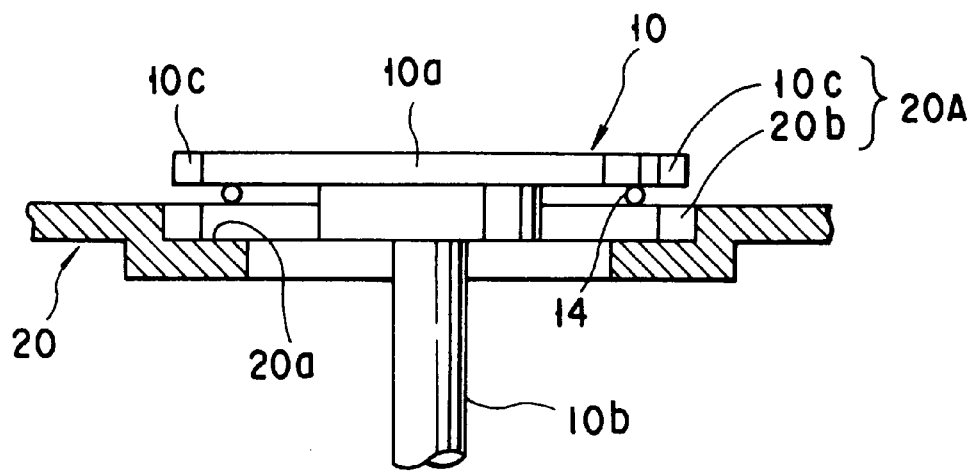
FIG. 4 is a cross sectional view showing in a magnified fashion the spin chuck and the bottom portion of the cup included in the apparatus shown in FIG. 3.
Figure 5:
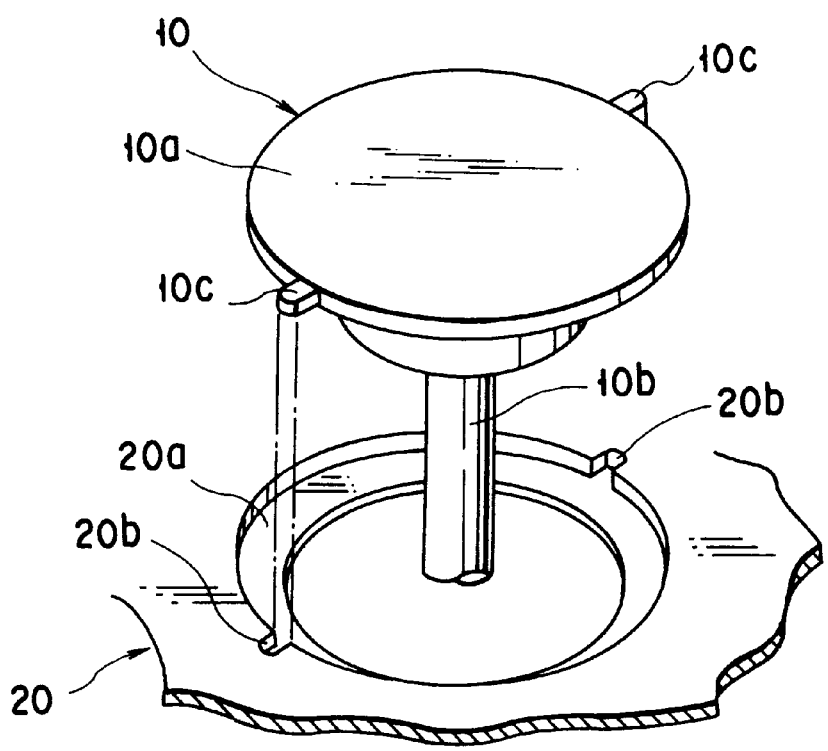
FIG. 5 is an oblique view showing in a magnified fashion the spin chuck and the bottom portion of the cup included in the apparatus shown in FIG. 3.

FIGS. 4 and 5 collectively show a seal means for hermetically sealing the contact region between the spin chuck 10 and the cup 20, and an engaging means for the engagement between the spin chuck 10 and the cup 20. As shown in these drawings, a seal member 14, which is a downward annular projection or an O-ring, is mounted to the lower surface of the spin chuck 10. The O-ring constituting the seal member 14 is made of a soft material such as a fluoroethylene series resin or a silicone rubber. The seal member 14 is embedded in a groove (not shown) formed in a lower portion of the spin chuck or is bonded to the lower surface of the spin chuck. Of course, it is possible for the seal member 14 to be mounted to the cup 20.

The drawings also show that two outward projections 10c are formed on the outer circumferential wall of the spin chuck 10. On the other hand, an annular recess 20a is formed along the lower opening of the cup 20. Also, two key grooves 20b are formed in the lower portion of the cup 20 to communicate with the annular recess 20a. When the spin chuck 10 is moved downward, the projections 10c of the spin chuck 10 are engaged with the key grooves 20b of the cup 20 so as to achieve an engagement between the spin chuck 10 and the cup 20.

Let us describe the method of treating a substrate with resist according to some aspects of the present invention:
(Method of First Aspect)

Figure 6A:
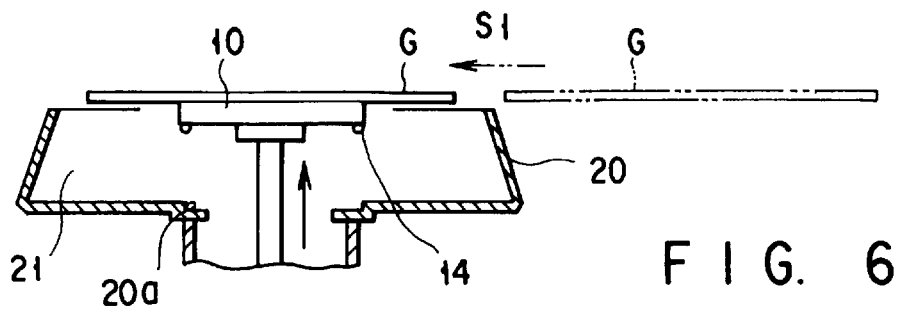
FIGS. 6A, 6B, 6C, 6D and 6E collectively form a flow chart showing steps S1 to S5 included in the method of treating a substrate with resist according to a first embodiment of the present invention.
Figure 6B:
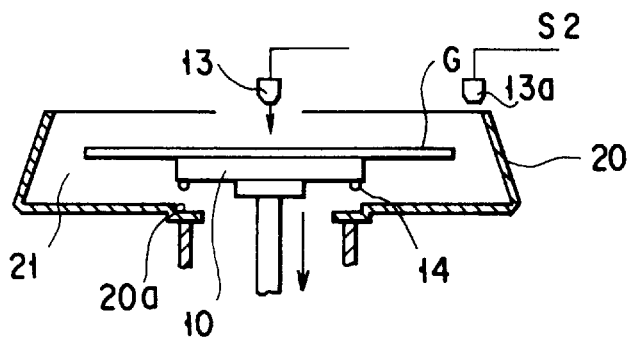

FIGS. 6A to 6E and 7 collectively show a treating method according to a first aspect of the present invention. In the first step (step S1), the spin chuck 10 is moved upward by driving the liftable cylinder 12, followed by operating the main arm 100 to dispose a substrate G on the spin chuck 10, as shown in FIG. 6A. Then, the main arm 100 is retreated, followed by moving the spin chuck 10 downward to a position at which the spin chuck 10 is not in contact with the bottom of the cup 20. Under this condition, the first nozzle 13 is moved to a position above the substrate 10, followed by allowing a resist solution to be dripped from the first nozzle 13 onto the upper surface of the substrate G, as shown in FIG. 6B (step S2). Incidentally, it is possible to supply a liquid thinner from the second nozzle 13a onto the upper surface of the substrate G and to spread the liquid thinner over the entire upper surface of the substrate G before the step of dripping the resist solution from the first nozzle 13 onto the substrate surface.

Figure 6C:
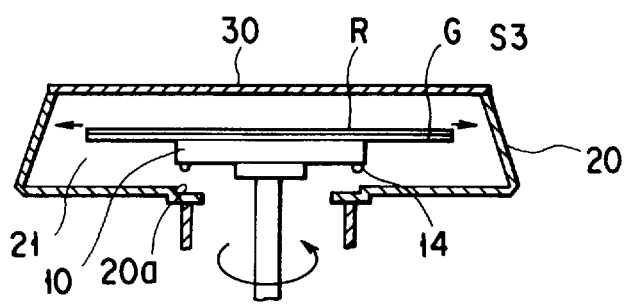

After the dripping step, the first nozzle 13 is retreated back to the home position, followed by closing the upper opening of the cup 20 with the lid 30. Under this condition, the spin chuck 10 is rotated by driving the first motor 11 so as to spread centrifugally the resist along the entire surface of the substrate B, as shown in FIG. 6C (step S3). In this step, the excess resist solution is centrifugally separated from the substrate G so as to be received by the cup 20. FIG. 7 shows how the rotation speed of the first motor 11 is controlled in step S3. Specifically, the first motor 11 is accelerated at the start-up time at an acceleration SA1 of 1,000 rpm/sec to reach a normal rotation speed SC1 of 1,000 rpm at time t1, followed by decelerating the rotation speed at time t2 at a deceleration SR1 of 1,000 rpm/min so as to stop rotation of the first motor 11 at time t3.

Figure 6D:
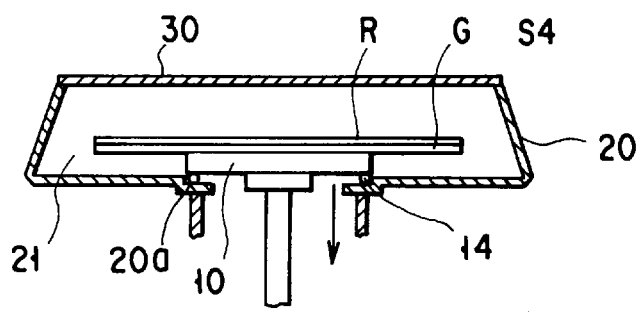

In the next step, the rotation of the spin chuck 10 is temporarily stopped for about 1 to 3 seconds (time t3 to time t4). During this period, the spin chuck 10 is moved downward until the seal member 14 abuts against the bottom of the cup 20 so as to hermetically close the treating space 21 defined by the spin chuck 10, cup 20 and lid 30, as shown in FIG. 6D (step S4).

Figure 6E:
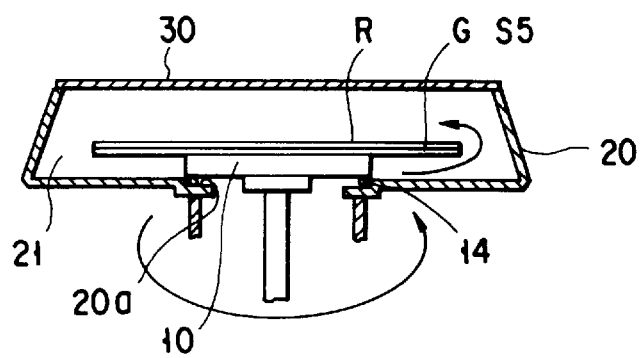

Further, the spin chuck 10 and the cup 20 are rotated in synchronism while the treating space 21 is kept hermetically closed, as shown in FIG. 6E (step S5). For rotating the spin chuck 10 and cup 20 in synchronism, the rotation speed (rpm) of the second motor 22 is detected by the encoder 72 while detecting the rotation speed (rpm) of the first motor 11 by the encoder 71. The rotation speeds thus detected of the first and second motors 11, 22 are fed from the encoders 71, 72 back to the CPU 50 so as to enable the CPU 50 to control the first and second motors 11, 22 such that these motors 11, 22 are rotated at the same angular speed (rpm). To be more specific, as shown in FIG. 7, the first and second motors 11, 22 are started up at time t4 at an acceleration SA2 (CPA) of 500 rpm/sec to reach a normal operating speed SC2 (CPS) of 1,000 rpm at time t5, followed by decelerating these motors at time t6 at a deceleration SR2 (CPR) of 500 rpm/sec so as to stop rotation of these motors at time t7. In step S5 shown in FIG. 6E, the upper surface of the substrate G is uniformly coated with a resist film in a thickness of 1 to 3 μm.

Incidentally, the required time in the graph of FIG. 7 is 1 to 1.5 seconds during the start-up time and time t1; 0 to 3 seconds during time t1 and time t2; 1 to 1.5 seconds during time t2 and time t3; 1 to 3 seconds during time t3 and time t4; 2 to 3 seconds during time t4 and time t5; 10 to 20 seconds during time t5 and time t6; and 2 to 3 seconds during time t6 and time t7.

(Method of Second Aspect)

Figure 8A:
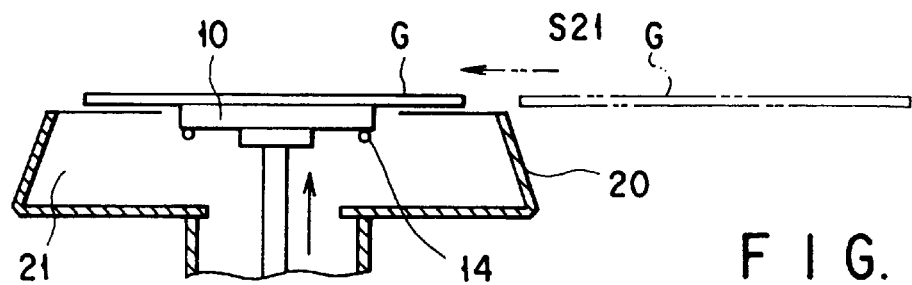
FIGS. 8A, 8B, 8C, 8D and 8E collectively form a flow chart showing steps S21 to S25 included in the method of treating a substrate with resist according to a second embodiment of the present invention.
Figure 8B:
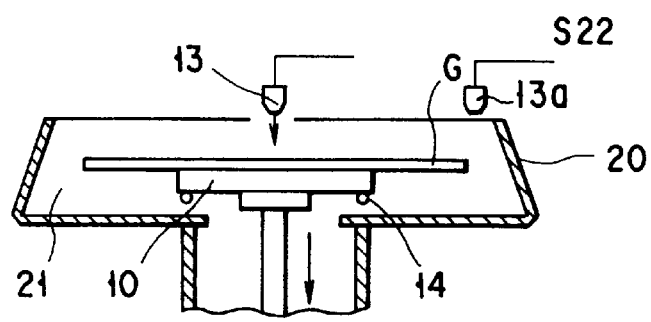

FIGS. 8A to 8E and 9 collectively show a treating method according to a second aspect of the present invention. In the first step (step S21), the spin chuck 10 is moved upward by driving the liftable cylinder 12, followed by operating the main arm 100 to dispose a substrate G on the spin chuck 10, as shown in FIG. 8A. Then, the main arm 100 is retreated, followed by moving the spin chuck 10 downward to a position at which the spin chuck 10 is not in contact with the bottom of the cup 20. Under this condition, the first nozzle 13 is moved to a position above the substrate 10, followed by allowing a resist solution to be dripped from the first nozzle 13 onto the upper surface of the substrate G, as shown in FIG. 8B (step S22). Incidentally, it is possible to supply a liquid thinner from the second nozzle 13a onto the upper surface of the substrate G and to spread the liquid thinner over the entire upper surface of the substrate G before the step of dripping the resist solution from the first nozzle 13 onto the substrate surface.

Figure 8C:
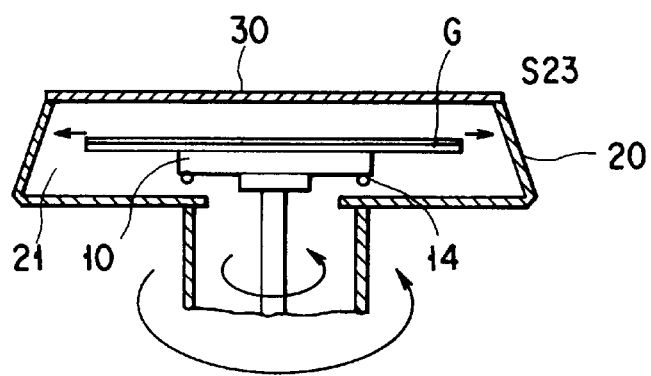

After the dripping operation, the nozzle 13 is retreated back to its home position, followed by covering the upper opening of the cup 20 with the lid 30. Then, the spin chuck 10 is rotated by the first motor 11. At the same time, the cup 20 is also rotated by the second motor 22, as shown in FIG. 8C (step S23). FIG. 9 is a graph showing how these first and second motors 11 and 22 are driven in this step S23. As apparent from the graph, the spin chuck 10 and the cup 20 are rotated at different accelerations at the start up time. Specifically, the spin chuck 10 is accelerated at an acceleration SA3 of 1,000 rpm/sec (first acceleration), with the cup 20 being accelerated at an acceleration CPA of 500 rpm/sec (second acceleration). As a result, the spin chuck 10 reaches a normal operating speed SC3 of 1,000 rpm at time t21 after the start-up, with the cup 20 reaching a normal operating speed CPC of 1,000 rpm at time t22 after the start up. It should be noted that an excess resist solution is centrifugally separated from the substrate G before the rotation speed of the cup 20 is increased to reach the normal operating speed of the spin chuck 10.

Figure 8D:
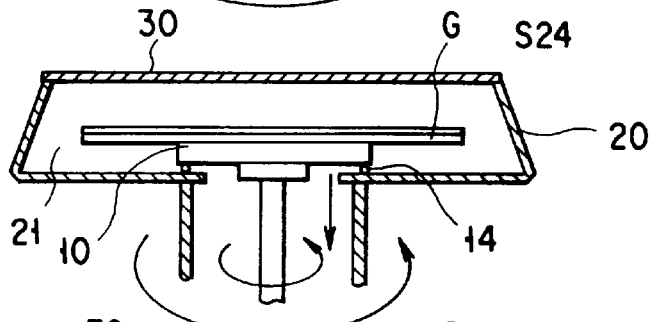
Figure 8E:
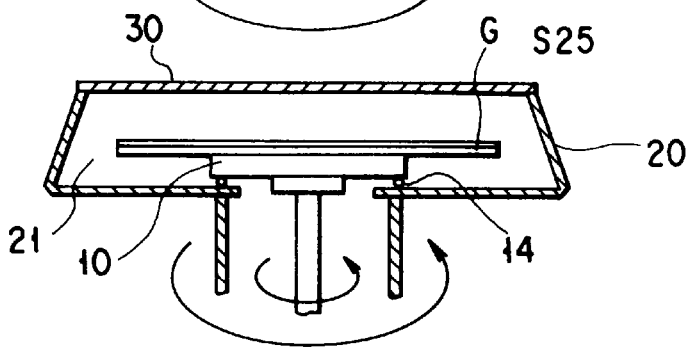

In the next step (step S24), the spin chuck 10 is moved downward so as to hermetically close the treating space 21 while the spin chuck 10 and cup 20 are rotated at substantially the same angular speed (rpm), as shown in FIG. 8D. While the treating space 21 is kept hermetically closed, the spin chuck 10 and cup 20 are rotated in synchronism in step S25 so as to spread the resist solution dripped onto the substrate surface uniformly over the entire surface of the substrate G, as shown in FIG. 8E. Then, the spin chuck 10 and cup 20 are decelerated in synchronism at a deceleration SR3 (CPR) so as to stop rotation thereof at time t24.

Incidentally, the required time in the graph of FIG. 9 is 1 to 1.5 seconds during the start-up time and time t21; 1 to 1.5 seconds during time t21 and time t22; 10 to 20 seconds during time t22 and time t23; and 2 to 3 seconds during time t23 and time t24.

For rotating the spin chuck 10 and cup 20 in synchronism, the rotation speed (rpm) of the second motor 22 is detected by the encoder 72 while detecting the rotation speed (rpm) of the first motor 11 by the encoder 71. The rotation speeds thus detected of the first and second motors 11, 22 are fed from the encoders 71, 72 back to the CPU 50 so as to enable the CPU 50 to control the first and second motors 11, 22 such that these motors 11, 22 are rotated at the same angular speed (rpm).

(Method of Third Aspect)

Figure 10A:
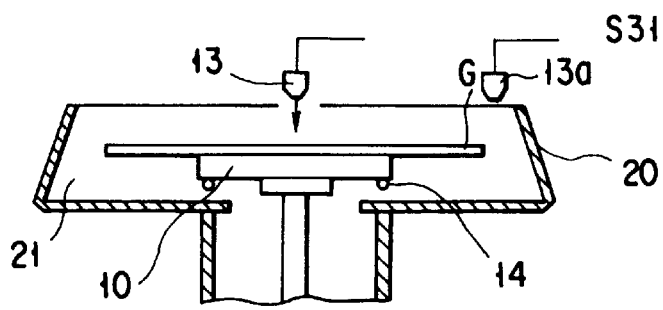
FIGS. 10A, 10B, 10C, 10D and 10E collectively form a flow chart showing steps S31 to S35 included in the method of treating a substrate with resist according to a third embodiment of the present invention.

FIGS. 10A to 10E and 11 collectively show a treating method according to a third aspect of the present invention. In operating the coating apparatus, the spin chuck 10 is moved upward first by driving the liftable cylinder 12, followed by operating the main arm 100 to dispose a substrate G on the spin chuck 10, as shown in FIG. 10A. Then, the main arm 100 is retreated, followed by moving the spin chuck 10 downward to a position at which the spin chuck 10 is not in contact with the bottom of the cup 20. Under this condition, the first nozzle 13 is moved to a position above the substrate G, followed by allowing a resist solution to be dripped from the first nozzle 13 onto the upper surface of the substrate G (step S31). Incidentally, it is possible to supply a liquid thinner from the second nozzle 13a onto the upper surface of the substrate G and to spread the liquid thinner over the entire upper surface of the substrate G before the step of dripping the resist solution from the first nozzle 13 onto the substrate surface.

Figure 10B:
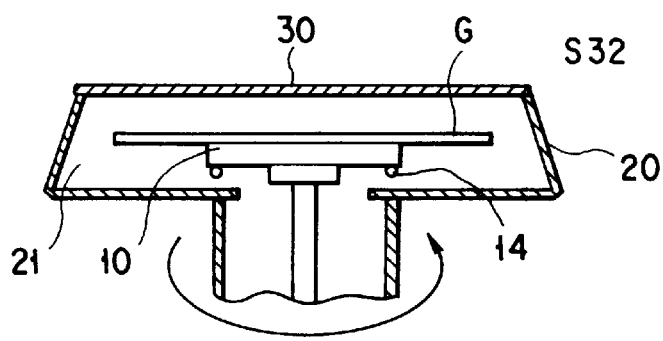
Figure 10C:
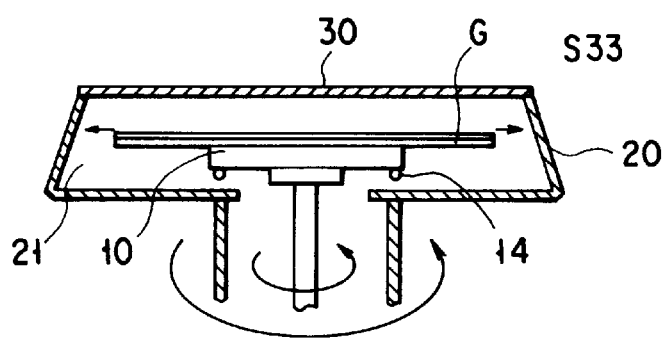

After the dripping operation, the first nozzle 13 is retreated back to its home position, followed by covering the upper opening of the cup 20 with the lid 30. Then, the cup 20 is rotated by the second motor 22 before rotation of the spin chuck 10, as shown in FIG. 10B (step S32). Further, the spin chuck 10 is rotated by the first motor 11, as shown in FIG. 10C (step S33).

FIG. 11 is a graph showing how these spin chuck 10 and cup 20 are rotated in step S33. As apparent from the graph, the spin chuck 10 and the cup 20 are rotated at different accelerations at the start up time. Specifically, the spin chuck 10 is accelerated at an acceleration SA4 of 1,000 rpm/sec (first acceleration), with the cup 20 being accelerated at an acceleration CPA of 500 rpm/sec (second acceleration). As a result, the spin chuck 10 reaches a normal operating speed SC4 of 1,000 rpm at time t32 after the start-up. The cup 20 also reaches a normal operating speed CPC of 1,000 rpm at time t32 after the start up. However, since the spin chuck 10 is accelerated at an acceleration of 1,000 rpm/sec, which is twice as high as that for the cup 20, the spin chuck 10 is started up at time t31 after start up of the cup rotation. It should be noted that an excess resist solution is centrifugally separated from the substrate G before the rotation speed of the spin chuck 10 is increased to reach the rotation speed of the spin chuck 10.

Figure 10D:
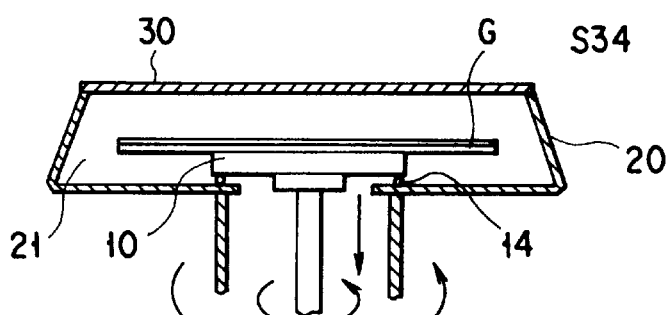
Figure 10E:
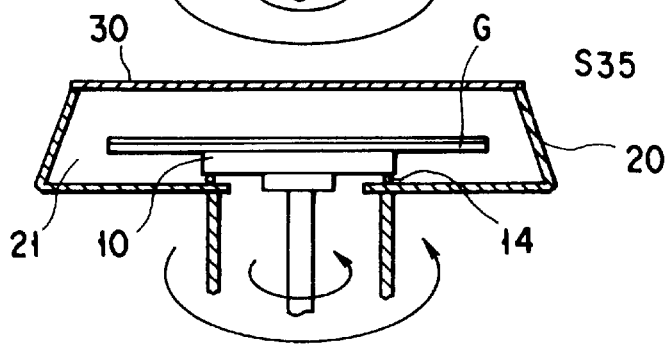

In the next step (step S34), the spin chuck 10 is moved downward so as to hermetically close the treating space 21 while the spin chuck 10 and the cup 20 are rotated at substantially the same angular speed (rpm), as shown in FIG. 10D. While the treating space 21 is kept hermetically closed, the spin chuck 10 and the cup 20 are rotated in synchronism in step S34 so as to spread the resist solution dripped onto the substrate surface uniformly over the entire surface of the substrate G, thereby forming a resist film having a uniform thickness of 1 to 3 $\mu$m, as shown in FIG. 10E. Then, the spin chuck 10 and cup 20 are decelerated in synchronism at a deceleration SR4 (CPR) so as to stop rotation thereof at time t34.

For rotating the spin chuck 10 and the cup 20 in synchronism, the rotation speed (rpm) of the second motor 22 is detected by the encoder 72 while detecting the rotation speed (rpm) of the first motor 11 by the encoder 71. The rotation speeds thus detected of the first and second motors 11, 22 are fed from the encoders 71, 72 back to the CPU 50 so as to enable the CPU 50 to control the first and second motors 11, 22 such that these motors 11, 22 are rotated at the same angular speed (rpm).

Incidentally, the required time in the graph of FIG. 11 is 1 to 1.5 seconds during the start-up time and time t31; 1 to 1.5 seconds during time t31 and time t32; 10 to 20 seconds during time t32 and time t33; and 2 to 3 seconds during time t33 and time t34.

In the method of the third aspect described above, the cup 20 is rotated first, followed by rotating the spin chuck 10. In this case, the spin chuck 10 and the cup 20 are allowed to be rotated in synchronism at the same angular speed in a shorter time, leading to an improved through-put.

Figure 12:
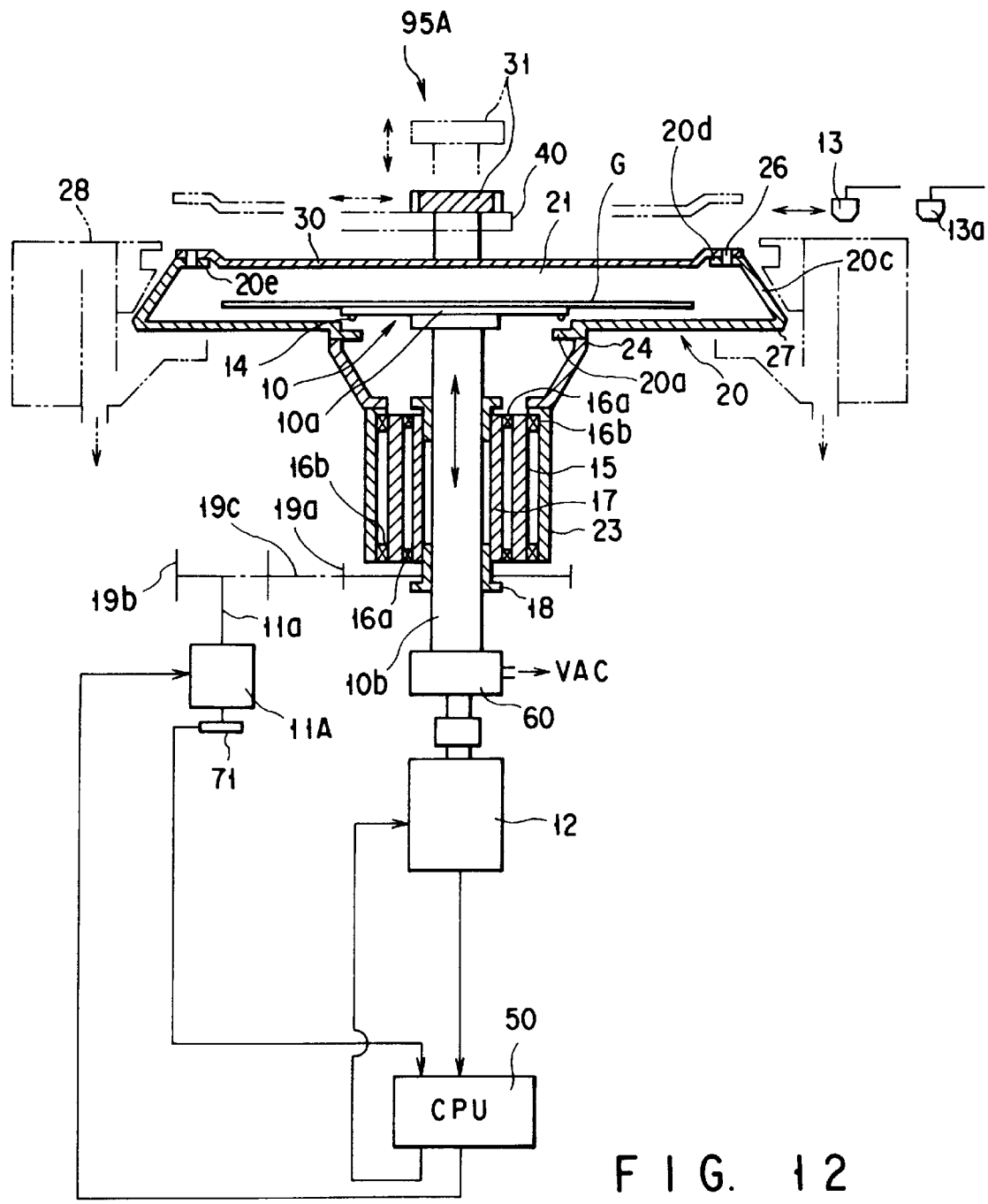
FIG. 12 is a cross sectional view showing an apparatus for treating a substrate with resist according another aspect of the present invention.

FIG. 12 shows a coating apparatus 95A according to another embodiment of the present invention. As apparent from the drawing, the apparatus shown in FIG. 12 is common in many portions with the apparatus shown in FIG. 3. Therefore, the common portions are denoted by the same reference numerals, and the explanation thereof is omitted in the following description.

The coating apparatus 95A shown in FIG. 12 differs from the apparatus shown in FIG. 3 in that both the spin chuck 10 and the cup 20 are rotated in synchronism by a single driving means, i.e., a motor 11A. Specifically, the driving shaft 11a of the motor 11A is connected to the shaft 10b of the spin chuck 10 via belt driving members 19a, 19b, 19c, with the result that the spin chuck 10 is rotated by the motor 11A. On the other hand, when the spin chuck 10 and the cup 20 are rotated in synchronism by the motor 11A, the spin chuck 10 is engaged with the cup 20 by means of engaging members 10c and 20b shown in FIG. 5.

(Method of Fourth Aspect)

FIGS. 13A to 13E and 14 collectively show a treating method according to a fourth aspect of the present invention, using the coating apparatus 95A shown in FIG. 12.

In the first step (S41), the spin chuck 10 is moved upward first by driving the liftable cylinder 12, followed by operating the main arm 100 to dispose a substrate G on the spin chuck 10, as shown in FIG. 13A. Then, the main arm 100 is retreated, followed by moving the spin chuck 10 downward to a position at which the spin chuck 10 is not in contact with the bottom of the cup 20. Under this condition, the first nozzle 13 is moved to a position above the substrate G, followed by allowing a resist solution to be dripped from the first nozzle 13 onto the upper surface of the substrate G, as shown in FIG. 13B (step S42). Incidentally, it is possible to supply a liquid thinner from the second nozzle 13a onto the upper surface of the substrate G and to spread the liquid thinner over the entire upper surface of the substrate G before the step of dripping the resist solution from the first nozzle 13 onto the substrate surface.

After the dripping operation, the first nozzle 13 is retreated back to its home position, followed by covering the upper opening of the cup 20 with the lid 30. Then, the spin chuck 10 is rotated by the motor 11A so as to spread centrifugally the resist dripped onto the substrate surface over the entire surface of the substrate G, as shown in FIG. 13C (step S43). In this step, the excess resist solution is centrifugally separated from the substrate G so as to be received by the cup 20.

Figure 14:
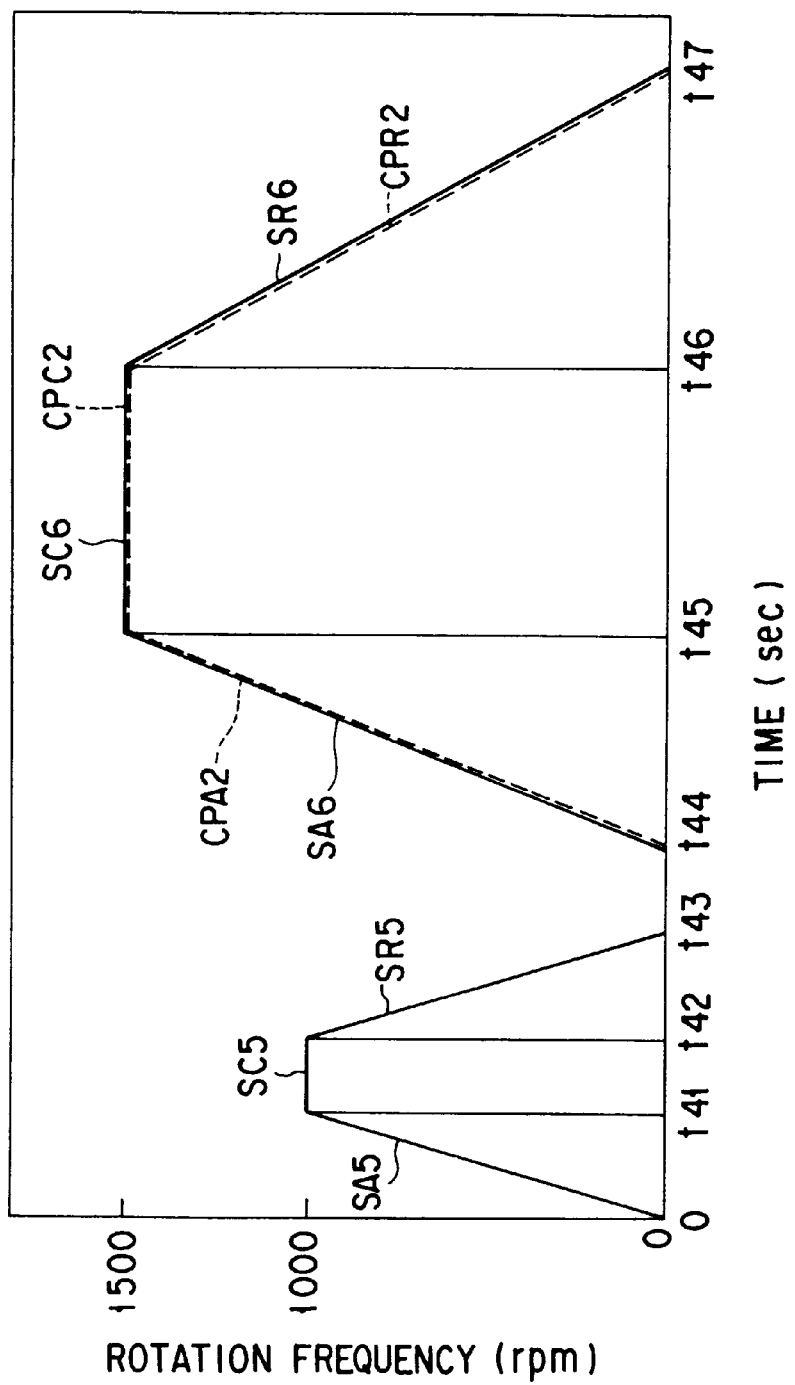
FIG. 14 is a timing chart showing the rotation speed (rpm) of each of the spin chuck and the cup relative to time in respect of the fourth embodiment of the present invention.

FIG. 14 is a graph showing how these spin chuck 10 and cup 20 are rotated in step S43. As apparent from the graph, the spin chuck 10 is accelerated at the start up time at an acceleration SA5 of 1,000 rpm to reach an operating rotation speed SC5 of 1,000 rpm at time t41 and, then, decelerated at a deceleration SR5 of 1,000 rpm/sec at time t42 so as to stop the rotation thereof at time t43.

In the next step (step S44), the spin chuck 10 is moved downward until the seal member 14 abuts against the bottom of the cup 20, while the rotation of the spin chuck 10 is kept stopped for about 1 to 3 seconds (between time t43 and time t44), so as to permit the spin chuck 10 to be engaged with the cup 20, as shown in FIG. 13D. As a result, the treating space 21 defined by the spin chuck 10, cup 20 and lid 30 is hermetically closed.

Then, the spin chuck 10 and the cup 20 are rotated in synchronism while the treating space 21 is kept hermetically closed, as shown in FIG. 13E (step S45). In step S45, both the spin chuck 10 and the cup 20 are accelerated at time t44 at an acceleration SA6 (CPA2) of 750 rpm/sec so as to reach an operating rotation speed SC6 (CPC2) of 1,500 rpm at time t45 and, then, decelerated at time t46 at a deceleration SR6 (CPR2) of 500 rpm/sec so as to stop the rotation thereof at time t47. During the step S45, the resist film on the substrate G is made uniform in thickness within a range of between 1 and 3 $\mu$m.

Incidentally, the required time in the graph of FIG. 14 is 1 to 1.5 seconds during the start-up time and time t41; 0 to 3 seconds during time t41 and time t42; 1 to 1.5 seconds during time t42 and time t43; 1 to 3 seconds during time t43 and time t44; 2 to 3 seconds during time t44 and time t45; 10 to 20 seconds during time t45 and time t46; and 3 to 4 seconds during time t46 and time t47.

The method of the fourth aspect described above permits saving the power consumption. Also, the thickness of the resist film can be made uniform, leading to an improved product yield.

The treating apparatus of the present invention constructed as described above can be used in a resist coating/developing system together with a washing device, a heat treating device and a developing device. In addition, the particular treating apparatus can be used independently.

In any of the embodiments described above, the treating apparatus of the present invention is used for coating an LCD substrate with resist. However, the apparatus can also be used for the treatment of semiconductor wafers.

As described above, the present invention permits improving the through-put, permits reducing the running cost, and also permits miniaturizing the treating apparatus. Further, the method of the present invention permits markedly improving the uniformity in thickness of the resist coating film, leading to an improved product yield. What should also be noted is that the angular speed of the substrate rotation and that of the cup rotation can be made equal to each other in a short time, leading to an improved throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An apparatus for treating a substrate with resist, comprising:

a spin chuck for horizontally holding a substrate;

first rotating means for variably rotating said spin chuck;

nozzle means for applying a resist solution to an upper surface of the substrate held by said spin chuck;

a cup having an upper opening through which the substrate is put in or taken out of said cup, and a lower opening through which extends the driving shaft of said spin chuck, and surrounding the substrate held by the spin chuck for receiving the liquid centrifugally separated from the substrate;

a lid member, which can be opened, disposed to close the upper opening of the cup so as to define a treating space together with the cup;

second rotating means for variably rotating the cup independently of the spin chuck rotation;

moving means for relatively moving at least one of the spin chuck and the cup, which are positioned away from each other, toward each other to achieve mutual contact; and seal means for hermetically sealing the contact region between the spin chuck and the cup when these spin chuck and cup are brought into mutual contact by said moving means, wherein the lower opening of the cup is closed by the spin chuck when the cup and the spin chuck are brought into mutual contact by the moving means so as to hermetically close the treating space, and the spin chuck and the cup are rotated in synchronism at the same angular speed by the first and second rotating means while keeping the treating space hermetically closed.

2. The apparatus according to claim 1, further comprising rotation speed detecting means for detecting the angular rotation speed of each of the first and second rotating means, and control means for controlling the angular rotation speed of each of the spin chuck and the cup on the basis of the detected angular rotation speed of the first and second rotating means.

3. The apparatus according to claim 2, wherein said control means permits controlling the acceleration of each of the first and second rotating means at the start up time until the rotation speed of each of the spin chuck and the cup reaches a normal rotation speed, and also permits controlling the deceleration of each of the first and second rotating means from the normal rotation speed until the rotation of each of the spin chuck and the cup is stopped.

4. The apparatus according to claim 2, wherein said control means permits controlling the operation of each of said moving means and said nozzle means.

5. The apparatus according to claim 2, further comprising driving means for moving said lid member so as to close or open the upper opening of the cup, said driving means being controlled by said control means.

6. The apparatus according to claim 1, wherein said seal means is mounted to said spin chuck.

7. The apparatus according to claim 1, wherein the lower opening of said cup is smaller in diameter than said spin chuck.

8. The apparatus according to claim 1, further comprising second nozzle means for applying a liquid capable of dissolving the resist on the substrate.

9. An apparatus for treating a substrate with resist, comprising:

a spin chuck for horizontally holding a substrate;

nozzle means for applying a resist solution to an upper surface of the substrate held by said spin chuck;

rotating means for variably rotating said spin chuck independently of a cup;

wherein said cup includes an upper opening through which the substrate is put in or taken out of said cup, and a lower opening through which extends the driving shaft of said spin chuck, and surrounding the substrate held by the spin chuck for receiving the liquid centrifugally separated from the substrate;

a lid member, which can be opened, disposed to close the upper opening of the cup so as to define a treating space together with the cup;

moving means for relatively moving at least one of the spin chuck and the cup, which are positioned away from each other, toward each other to achieve mutual contact;

seal means for hermetically sealing the contact region between the spin chuck and the cup when these spin chuck and cup are brought into mutual contact by said moving means;

first engaging member formed in the spin chuck; and second engaging member formed in the cup for engagement with said first engaging member;

wherein, when the cup and the spin chuck are brought into mutual contact by the moving means, the first engaging member is engaged with the second engaging member so as to allow the lower opening of the cup to be closed by the spin chuck and, thus, to hermetically close the treating space, and the spin chuck and the cup are rotated in synchronism at the same angular speed by said rotating means while keeping the treating space hermetically closed.

10. The apparatus according to claim 9, further comprising rotation speed detecting means for detecting the angular rotation speed of said rotating means, and control means for controlling the angular rotation speed of each of the spin chuck and the cup on the basis of the detected angular rotation speed of the rotating means.

11. The apparatus according to claim 10, wherein said control means permits controlling the acceleration of rotating means at the start up time until the rotation speed of the rotating means reaches a constant rotation speed, and also permits controlling the deceleration of the rotating means from the constant rotation speed until the rotation of the rotating means is stopped.

12. The apparatus according to claim 10, wherein said control means permits controlling the operation of each of said moving means and said nozzle means.

13. The apparatus according to claim 10, further comprising driving means for moving said lid member so as to close or open the upper opening of the cup, said driving means being controlled by said control means.

14. The apparatus according to claim 9, wherein said seal means is mounted to said spin chuck.

15. The apparatus according to claim 9, wherein the lower opening of said cup is smaller in diameter than said spin chuck.

16. The apparatus according to claim 9, further comprising second nozzle means for applying the liquid capable of dissolving the resist on the substrate.

17. A method of treating a substrate with resist, in which a resist solution is supplied to a substrate rotated by a spin chuck, and the liquid centrifugally separated from the substrate is received by a cup, comprising the steps of:

(a) allowing a substrate to be held substantially horizontal by a spin chuck;

(b) supplying a resist solution to an upper surface of the substrate;

(c) starting up rotation of the substrate about its own axis together with the spin chuck, and starting up rotation of a cup independently of said chuck;

(d) detecting the angular rotation speed of the spin chuck;

(e) detecting the angular rotation speed of the cup;

(f) controlling the rotation of at least one of the cup and the spin chuck so as to permit the detected rotation speed of the cup to be equal to the detected rotation speed of the spin chuck;

(g) relatively moving at least one of the spin chuck and the cup to bring these spin chuck and cup into a hermetic mutual contact to form an integral structure when the detected rotation speed of the cup has been found to be equal to that of the spin chuck; and (h) allowing the cup and the spin chuck to be rotated in synchronism so as to spread the resist solution or liquid for resist-treatment supplied to the substrate along the entire region of the upper surface of the substrate under a hermetic atmosphere.

18. The method according to claim 17, wherein the spin chuck and the cup are started up simultaneously in step (c).

19. The method according to claim 17, wherein the spin chuck is started up after start up of the cup in step (c).

20. The method according to claim 17, wherein the acceleration of each of the spin chuck and the cup is controlled in step (c) before the angular rotation speed of each of these spin chuck and cup reaches a predetermined operating speed after the start up.

21. The method according to claim 17, wherein both the cup and the spin chuck, which are under mutual contact, are decelerated after step (h) such that the rotation of these cup and spin chuck is stopped simultaneously.

22. The method according to claim 17, further comprising the steps of, the substrate is supplied a liquid for resist-treatment before said step (b).

23. A method of treating a substrate with resist, in which a resist solution is supplied to a substrate rotated by a spin chuck, and the liquid centrifugally separated from the substrate is received by a cup, comprising:

(A) the step of allowing the substrate to be held substantially horizontal by a spin chuck;

(B) the step of supplying a resist solution to the upper surface of the substrate held on said spin chuck;

(C) the first spreading step, in which the rotation of the spin chuck is started up independently of the cup at a first acceleration to a first desired angular rotation speed so as to spread the resist solution or the liquid for resist-treatment supplied to the substrate along the upper surface of the substrate;

(D) the step of stopping the rotation of the spin chuck;

(E) the step of relatively moving at least one of the spin chuck and the cup toward each other so as to bring these spin chuck and cup into a hermetic mutual contact so as to form an integral structure and to provide a hermetic environment around the substrate held on the spin chuck; and (F) the second spreading step, in which the rotation of each of the cup and the spin chuck is accelerated to reach a second desired angular rotation speed at a second acceleration lower than said first acceleration so as to permit the cup and the spin chuck to be rotated in synchronism, thereby to spread further the resist solution or liquid for resist-treatment along the entire region of the upper surface of the substrate under a hermetic atmosphere.

24. The method according to claim 23, wherein said first desired angular rotation speed in the first spreading step (C) is equal to said second desired angular rotation speed in the second spreading step (F).

25. The method according to claim 23, wherein said first desired angular rotation speed in the first spreading step (C) is lower than said second desired angular rotation speed in the second spreading step (F).

26. The method according to claim 23, wherein both the cup and the spin chuck, which are under mutual contact, are decelerated after step (F) such that the rotation of these cup and spin chuck is stopped simultaneously.

27. The method according to claim 23, further comprising the steps of, the substrate is supplied a liquid for resist-treatment before said step (B).

* * * * *